(12) United States Patent
Soundara Pandian et al.

(10) Patent No.: US 11,719,669 B2
(45) Date of Patent: Aug. 8, 2023

(54) DEVICE FOR DETERMINING INFORMATION OF A SUBSTANCE IN A MATTER

(71) Applicant: Silterra Malaysia Sdn. Bhd., Kulim (MY)

(72) Inventors: Mohanraj Soundara Pandian, Kulim (MY); Arjun Kumar Kantimahanti, Kulim (MY)

(73) Assignee: Silterra Malaysia Sdn. Bhd., Kulim (MY)

( * ) Notice: Subject to any disclaimer, the term of this patent is extended or adjusted under 35 U.S.C. 154(b) by 148 days.

(21) Appl. No.: 17/180,172

(22) Filed: Feb. 19, 2021

(65) Prior Publication Data

US 2021/0341424 A1 Nov. 4, 2021

(30) Foreign Application Priority Data

Apr. 30, 2020 (MY) .......................... PI 2020002181

(51) Int. Cl.
*G01N 29/02* (2006.01)
*H01L 41/113* (2006.01)

(52) U.S. Cl.
CPC ........ *G01N 29/022* (2013.01); *H01L 41/1132* (2013.01); *G01N 2291/0256* (2013.01); *G01N 2291/02466* (2013.01); *G01N 2291/0423* (2013.01); *G01N 2291/0426* (2013.01)

(58) Field of Classification Search
CPC ... H01L 41/1132; H01L 27/20; G01N 29/022; G01N 2291/02466; G01N 2291/0256; G01N 2291/0423; G01N 2291/0426; G01N 2291/0255; G01N 2291/0427
See application file for complete search history.

(56) References Cited

U.S. PATENT DOCUMENTS

| | | | |
|---|---|---|---|
| 7,027,921 B2 | 4/2006 | Kalantar-Zadeh et al. | |
| 7,437,907 B2* | 10/2008 | Kimura | G01N 29/222 73/24.01 |
| 9,290,376 B1* | 3/2016 | Cheng | B81C 1/00238 |
| 2009/0124513 A1 | 5/2009 | Berg et al. | |
| 2016/0074863 A1* | 3/2016 | Sturmer | B01L 3/502792 204/602 |
| 2016/0116438 A1* | 4/2016 | Pamula | B01L 3/502792 204/454 |
| 2018/0151622 A1* | 5/2018 | Soundara Pandian | H03H 9/25 |
| 2019/0100427 A1* | 4/2019 | Soundara Pandian | B06B 1/0644 |

* cited by examiner

*Primary Examiner* — Francis C Gray (74) *Attorney, Agent, or Firm* — Preston Smirman; Smirman IP Law, PLLC (57) ABSTRACT

A device for determining information of a substance in a matter comprising a substrate layer; an inter-layer dielectric disposed on the substrate layer; an electronic circuitry substantially formed in the inter-layer dielectric and includes a plurality of metal layers with at least one metal layer being used as an inner electrode, a sensing instrument having at least one sensing component that includes a piezoelectric layer and the inner electrode that is positioned adjacent to an inner surface of the piezoelectric layer, and at least one binding layer disposed on the inter-layer dielectric for binding the substance, wherein the sensing component allows the device to determine the information of the substance upon detecting presence of the substance at the binding layer.

22 Claims, 7 Drawing Sheets

DEVICE FOR DETERMINING INFORMATION OF A SUBSTANCE IN A MATTER

CROSS-REFERENCE TO RELATED APPLICATION

The instant application claims priority to Malaysia Patent Application Serial No. PI 2020002181 filed Apr. 30, 2020, the entire specification of which is expressly incorporated herein by reference.

FIELD OF THE INVENTION

The present invention relates to a sensing technology, and more particularly to a device configured with at least one sensing component and at least one binding layer that are integrated with a complementary metal-oxide-semiconductor (CMOS) device for determining information of a substance in a matter.

BACKGROUND OF THE INVENTION

A chemical sensor is a device that measures and detects qualitative or quantitative information of a specific chemical component through converting its chemical information into an electronic data. Particularly, the chemical sensor is useful in applications including food quality and pollution control, health monitoring, odour and taste analysis, chemical threat detection, robot control, or home detection system such as carbon monoxide detector. An example of a commonly used chemical sensor is a breath analyser that is designed specifically to measure blood alcohol content of a person. Alcohol molecules exhaled therefrom interacts with receptor of the breath analyser to trigger a chemical reaction and then induces chemical difference to that of a controlled chamber. The chemical difference is converted into an electrical signal and prompted on-screen to indicate the presence of the alcohol molecules.

An acoustic wave device consisting of a piezoelectric substrate sandwiched between two electrodes can be used as a sensing component that adopts acoustic or mechanical detection mechanism. Particularly, the sensing feature is accomplished by creating acoustic waves through inducing a crystal lattice vibration within the device. In general, the acoustic waves are distinguishable by velocity and displacement direction, and combinable into various combinations depending on material and boundary conditions of the device. In a typical acoustic wave device, two sets of interdigital transducers (IDT) are provided for converting electric field energy into mechanical wave energy, and then converting the mechanical energy back into the electric filed. An example of the acoustic wave device is a compact surface acoustic wave (SAW) device that propagates a localised SAW along surface of the piezoelectric substrate and away from the IDT electrodes in opposite directions. Another example of the acoustic wave device is a bulk acoustic wave device operable at frequencies higher than the SAW device.

Use of a SAW device as a sensor for detecting liquid or gaseous environment has been disclosed in U.S. Pat. No. 7,027,921, in which the patent discloses a device configuration including a substrate of a specific quartz crystal, at least one IDT formed on the substrate, a piezoelectric film deposited on the crystal and IDT, and a biological sensitive layer deposited on the piezoelectric film. The sensing technology is further improvised through integrating with a complementary metal-oxide-semiconductor (CMOS) technology for providing a biosensor device. An example of such device has been disclosed in United States Patent Publication No. 2009/0124513, in which the biosensor device is a CMOS integrated circuit having a SAW device provided with a biochemical coating formed between input IDT and output IDT of the SAW device. A surface acoustic wave signal is generated therefrom when at least one analyte is captured on the biochemical coating. Nevertheless, the improvised device experiences fabrication difficulty due to size limitation in a conventional device fabrication process.

SUMMARY OF THE INVENTION

The invention disclosed herein shall provide a solution to the abovementioned limitations and drawbacks in fabrication of the device. By this invention, the device is configured with at least one binding layer for binding a substance in a matter and a sensing instrument that includes at least one sensing component embedded within an electronic circuitry of a CMOS device. The sensing component operates at either or both surface acoustic wave mode and bulk acoustic wave mode at a frequency shiftable by presence of the substance at the binding layer.

The main objective of the invention is to provide a device for determining information of a substance in a matter, in which the device is fabricated with minimal manufacturing complexity, and provided with a configuration of low electrical parasitic level. The device provides at least one substance specific binding layer for binding a corresponding substance. Further, the device utilizes at least one metal layer from its electronic circuitry as electrode to operate a sensing component, such that information of the substance can be determined through binding the substance at the binding layer. Such configurations of the device to make use of the metal layers from the electronic circuitry as electrodes of the sensing component allow the device to be built in a compact and thin structure. In addition, the sensing component embedded within the electronic circuitry of a complementary metal-oxide-semiconductor (CMOS) device is operable at either or both surface acoustic wave mode and bulk acoustic wave mode to simultaneously detect one or more substances in the state of solid, liquid, gas, or any combination thereof. The device can operate with a single mode or multi-mode sensing instrument that contains any one or combination of surface acoustic wave mode operating sensing component, Lamb mode operating sensing component and film bulk acoustic resonator mode operating sensing component. With the use of the present invention that provides a sensing instrument with sensing components of more than one mode, detection sensitivity of the sensing instrument can be enhanced, in which minute changes at the binding layer can be identified and transmitted rapidly and accurately in a form of electrical signal to determine the information relating to amount, mass and type of the substance. With the device having a sensing instrument that contains two or more different mode operating sensing components, information of a matter having substances in different states such as a solid suspended in liquid can be detected and obtained.

In a first aspect of the invention there is provided a device for determining information of a substance in a matter comprising a substrate layer; an inter-layer dielectric disposed on the substrate layer; an electronic circuitry substantially formed in the inter-layer dielectric and includes a plurality of metal layers with at least one metal layer being used as an inner electrode; a sensing instrument having at least one sensing component that includes a piezoelectric layer and the inner electrode that is positioned adjacent to an inner surface of the piezoelectric layer; and at least one binding layer disposed on the inter-layer dielectric for binding the substance; wherein the sensing component allows determination of the information of the substance upon detecting presence of the substance at the binding layer.

In this aspect of the invention, the sensing component may further include at least one outer electrode being one of the metal layers from the electronic circuitry, the outer electrode can be disposed between the binding layer and outer surface of the piezoelectric layer.

In this aspect of the invention, the inter-layer dielectric can be formed with a cavity adjacent to at least a portion of the inner surface of the piezoelectric layer with one or more inner electrodes being accommodated therewithin.

In this aspect of the invention, the sensing component may operate at surface acoustic wave mode by having two or more inner electrodes configured in an alternate charge arrangement to produce transverse waves. As used herein, the term "charge" refers to anodic or cathodic properties of the electrode.

In this aspect of the invention, the sensing component may operate at Lamb mode by having two or more inner electrodes configured in an alternate charge arrangement and the outer electrodes having a charge opposite of their corresponding inner electrodes to produce longitudinal waves.

In this aspect of the invention, the sensing component may operate at film bulk acoustic resonator mode by having the inner electrode being an anode and the outer electrode being a cathode to produce transverse and longitudinal waves.

In this aspect of the invention, the device can be formed with at least a bond-pad opening that extends through the binding layer and partially into the inter-layer dielectric until the bond-pad opening reaches one of the metal layers from the electronic circuitry that serves as a bond pad.

In this aspect of the invention, the information may include any one or a combination of amount, mass and type of the substance.

In this aspect of the invention, the inter-layer dielectric can be made of silicon dioxide, silicon nitride or silicon oxynitride.

In a second aspect of the invention there is provided a device for determining information of a substance in a matter comprising a substrate layer; an inter-layer dielectric disposed on the substrate layer; an electronic circuitry substantially formed in the inter-layer dielectric includes a plurality of metal layers with at least one metal layer being used as an inner electrode and at least one metal layer being used as an outer electrode; a sensing instrument having at least one sensing component that includes a piezoelectric layer having an inner surface and an outer surface, the inner electrode being disposed on the inner surface of the piezoelectric layer, and the outer electrode being disposed on the outer surface of the piezoelectric layer; and at least one binding layer disposed on the inter-layer dielectric and adjacent to the outer electrode for binding the substance; wherein the inter-layer dielectric is formed with a cavity adjacent to at least a portion of the inner surface of the piezoelectric layer with the inner electrode being accommodated therewithin such that the sensing component produces either or both longitudinal waves, and transverse and longitudinal waves for the device to determine the information of the substance upon detecting presence of the substance at the binding layer.

In this aspect of the invention, the sensing component may operate at Lamb mode by having two or more inner electrodes configured in an alternate charge arrangement and the outer electrodes having a charge opposite of their corresponding inner electrodes to produce the longitudinal waves.

In this aspect of the invention, the sensing component may operate at film bulk acoustic resonator mode by having the inner electrode being an anode and the outer electrode being a cathode to produce the transverse and longitudinal waves.

In this aspect of the invention, the device can be formed with at least a bond-pad opening that extends through the binding layer and partially into the inter-layer dielectric until the bond-pad opening reaches one of the metal layers from the electronic circuitry that serves as a bond pad.

In this aspect of the invention, the information may include any one or a combination of amount, mass and type of the substance.

In this aspect of the invention, the inter-layer dielectric can be made of silicon dioxide, silicon nitride or silicon oxynitride.

In a third aspect of the invention there is provided a device for determining information of a substance in a matter comprising a substrate layer; an inter-layer dielectric disposed on the substrate layer; an electronic circuitry substantially formed in the inter-layer dielectric and includes a plurality of metal layers of which a number of them are used as inner electrodes and outer electrodes; sensing instrument having a first sensing section provided with at least one sensing component that includes a piezoelectric layer having an inner surface and an outer surface, and the inner electrode being disposed on the inner surface of the piezoelectric layer; and a second sensing section provided with at least one sensing component that includes the piezoelectric layer, the inner electrode being disposed on the inner surface of the piezoelectric layer, and the outer electrode being disposed on the outer surface of the piezoelectric layer; and at least one binding layer disposed on the inter-layer dielectric and adjacent to the outer electrode for binding the substance; wherein the inter-layer dielectric at the second sensing section is formed with a cavity adjacent to at least a portion of the inner surface of the piezoelectric layer with one or more inner electrodes being accommodated therewithin such that the sensing instrument produces either or both transverse and longitudinal waves for the device to determine the information of the substance upon detecting presence of the substance at the binding layer.

In this aspect of the invention, the sensing component within the first sensing section operates at surface acoustic wave mode by having two or more inner electrodes configured in an alternate charge arrangement to produce the transverse waves.

In this aspect of the invention, the sensing component within the second sensing section operates at Lamb mode by having two or more inner electrodes configured in an alternate charge arrangement and the outer electrodes having a charge opposite of their corresponding inner electrodes to produce the longitudinal waves.

In this aspect of the invention, the sensing component within the second sensing section operates at film bulk acoustic resonator mode by having the inner electrode being an anode and the outer electrode being a cathode to produce the transvers and longitudinal waves.

In this aspect of the invention, the device can be formed with at least a bond-pad opening that extends through the binding layer and partially into the inter-layer dielectric until the bond-pad opening reaches one of the metal layers from the electronic circuitry that serves as a bond pad.

In this aspect of the invention, the information may include any one or a combination of amount, mass and type of the substance.

In this aspect of the invention, the inter-layer dielectric can be made of silicon dioxide, silicon nitride or silicon oxynitride.

One skilled in the art will readily appreciate that the present invention is well adapted to carry out the objects and obtain the ends and advantages mentioned, as well as those inherent therein. The embodiment described herein is not intended as limitations on the scope of the invention.

BRIEF DESCRIPTION OF THE DRAWINGS

For the purpose of facilitating an understanding of the invention, there is illustrated in the accompanying drawing the preferred embodiments from an inspection of which when considered in connection with the following description, the invention, its construction and operation and many of its advantages would be readily understood and appreciated.

DETAILED DESCRIPTION OF THE INVENTION

The invention will now be described in greater detail, by way of example, with reference to the drawing.

Disclosed herewith is a device for determining information of one or more substances in a matter. The device is a complementary metal-oxide-semiconductor (CMOS) device. In this disclosure, the matter is defined as any substance with a mass and volume that is made up of one or more substances that can be solid, liquid, gas or combination thereof. The word 'substance' refers to an element, compound, pure substance or impure substance in the matter. Upon detecting presence of the substance, the device determines information of the substance that includes either one or any combination of amount, mass and type of the substance.

FIG. 1 to FIG. 7 illustrates an exemplary device 100 of the present invention for determining information of a substance in a matter. A substrate layer 101 is provided as the base and one of the outermost layers of the device 100. Disposed on the substrate layer 101 is an inter-layer dielectric 102 having an electronic circuitry substantially formed therein and supported by the substrate layer 101. The inter-layer dielectric 102 is made of silicon dioxide, silicon nitride or silicon oxynitride. The electronic circuitry includes a plurality of metal layers 103, in which at least one metal layer 103 is used as an inner electrode 201. Additionally, in some embodiments of the invention that are depicted in FIG. 2 to FIG. 7, at least one metal layer 103 of the electronic circuitry is used as an outer electrode 202. The device 100 includes a sensing instrument 300 comprising one or more sensing components that are formed by a piezoelectric layer 104, the inner electrode 201, and optionally the outer electrode 202, in which the number of inner electrodes 201 and outer electrodes 202 for each sensing component can be different or the same. The piezoelectric layer 104 has an inner surface that faces towards the direction of the substrate layer 101 and an outer surface that faces away from the direction of the binding layer 105, which respectively enables the inner electrode 201 and the outer electrode 202 to be positioned adjacent and attached thereto. The device 100 is provided with at least one binding layer 105 disposed on the inter-layer dielectric 102 as the other outermost layer of the device 100, for binding the substance to determine its information. The binding layer 105 is preferred to be substance specific in order to bind a specific individual or range of substances that correspond with the binding layer 105. Thus, more than one binding layer 105 are applicable to the device 100 for binding different substances in the matter. At least a bond-pad opening 106 is formed by extending through the binding layer 105 and partially into the interlayer dielectric 102 until the bond-pad opening 106 reaches one of the metal layers 103 from the electronic circuitry that serves as a bond pad 107.

The sensing component operates at either surface acoustic wave (SAW) mode, Lamb mode or film bulk acoustic resonator (FBAR) mode. In a sensing instrument 300 that contains more than one sensing component, each sensing component is electronically separated from one another by the inter-layer dielectric 102 and produces either or both transverse waves and longitudinal waves depending on its mode. When the substance is bound onto the binding layer 105, the mass of the substance is exerted onto the binding layer 105, thereby indicating presence of the substance. Due to the additional mass of the substance applied onto the binding layer 105, the frequency of waves produced by the sensing component that corresponds to the binding layer is reduced. A shift in the frequency of the waves produced by the sensing component when the substance is detected and such data is transmitted in the form of electrical signals to a processor with a determination module that translates the electrical signal into information related to amount, mass and type of the substance. The processor is connectable to the electronic circuitry externally from the device 100 or internally through being embedded within the device 100. Upon determining the information of the substance, the information is shown on a display provided on the device 100 or a third-party device such as a computer or any smart devices including a phone and a tablet that communicates wiredly or wirelessly with the device 100 for users to obtain the determined information.

Figure 1:
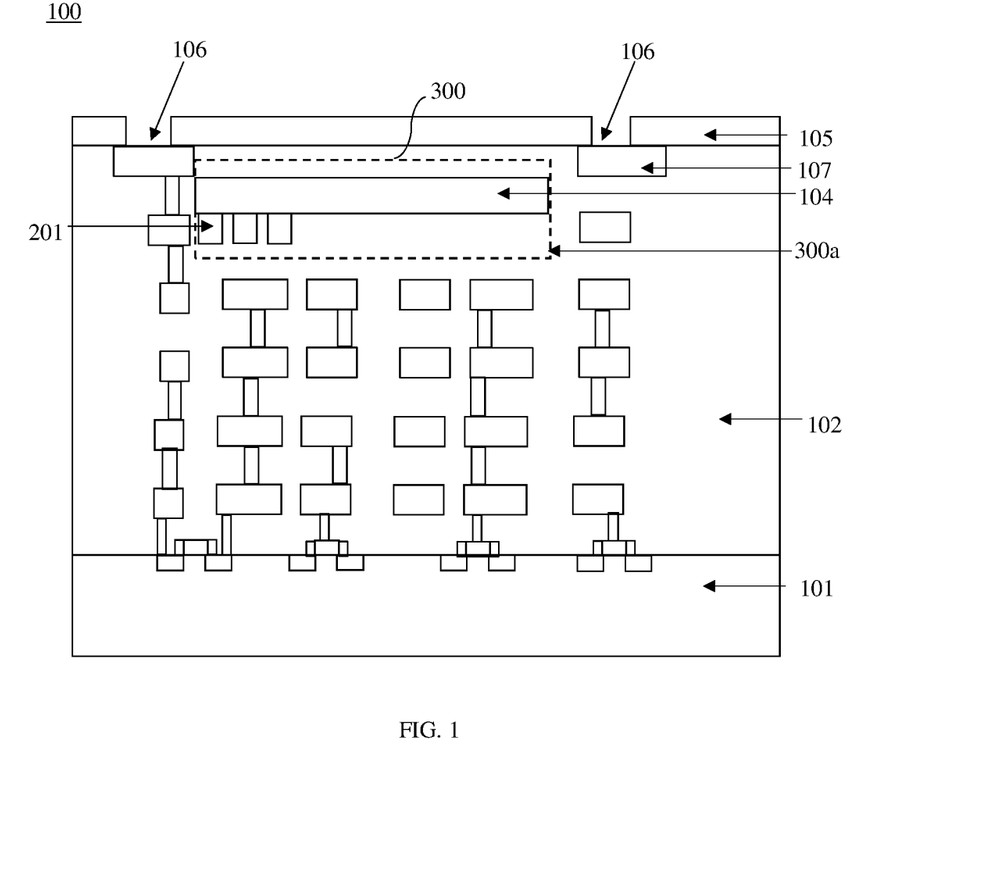
FIG. 1 is a schematic diagram illustrating a preferred embodiment of the device that comprises a sensing instrument having a sensing component that operates at surface acoustic wave (SAW) mode.

The sensing component 300a that operates at SAW mode is provided with an array of electrodes, in particular an array of inner electrodes 201 that are configured in alternate charge arrangement to produce transverse waves. As used herein, the term "array of electrodes" indicates two or more electrodes. A preferred method to fabricate such configuration of the inner electrode 201 is to etch a single inner electrode piece into two or more inner electrodes 201 that are spaced apart with the inter-layer dielectric 102 filling up the space between the inner electrodes 201. The phrase 'alternate charge arrangement' used herein is defined by each inner electrode being in a charge opposite of its adjacent inner electrode. For example, the sensing component 300a has a first, second and third inner electrode arranged in sequential order. The first inner electrode is an anode that is positively charged to attract negative electrons, and the second inner electrode positioned beside the first inner electrode is a cathode that is negatively charged to attract positive electrons. The third inner electrode that is positioned next to the second inner electrode is an anode which is positively charged to attract negative electrons. In this SAW mode operating sensing component 300a, the inner surface of the piezoelectric layer 104 is attached with the inner electrodes 201 whereas the outer surface of the piezoelectric layer 104 is in contact with the inter-layer dielectric 102 without having outer electrodes 202 attached thereto.

Figure 2:
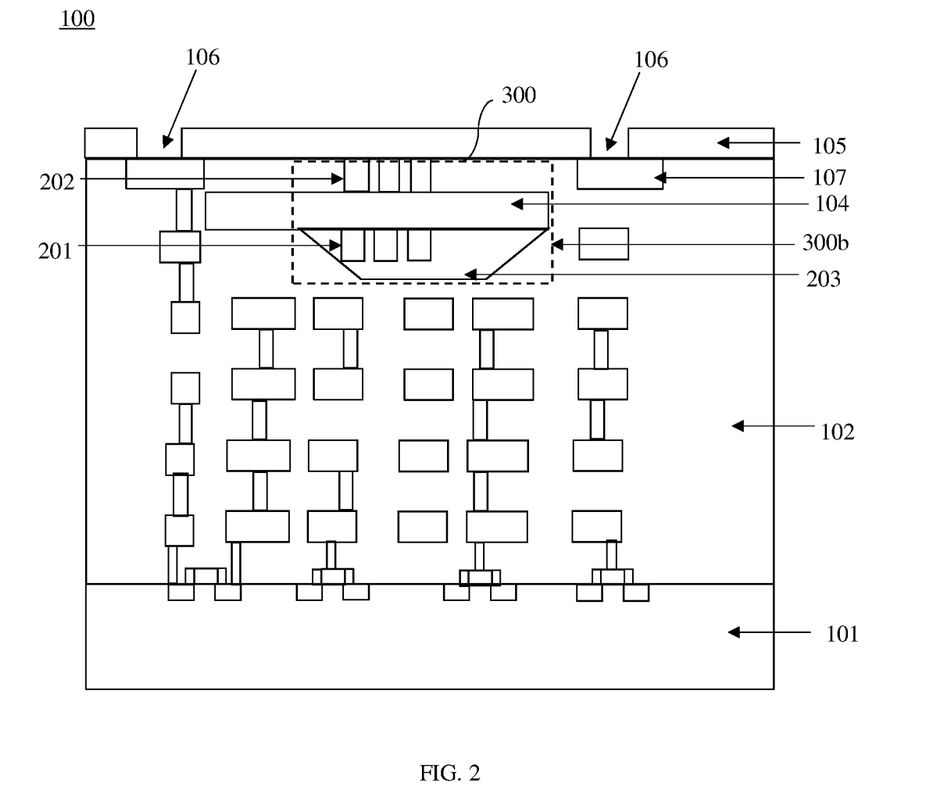
FIG. 2 is a schematic diagram illustrating a preferred embodiment of the device that comprises a sensing instrument having a sensing component that operates at Lamb mode.
Figure 3:
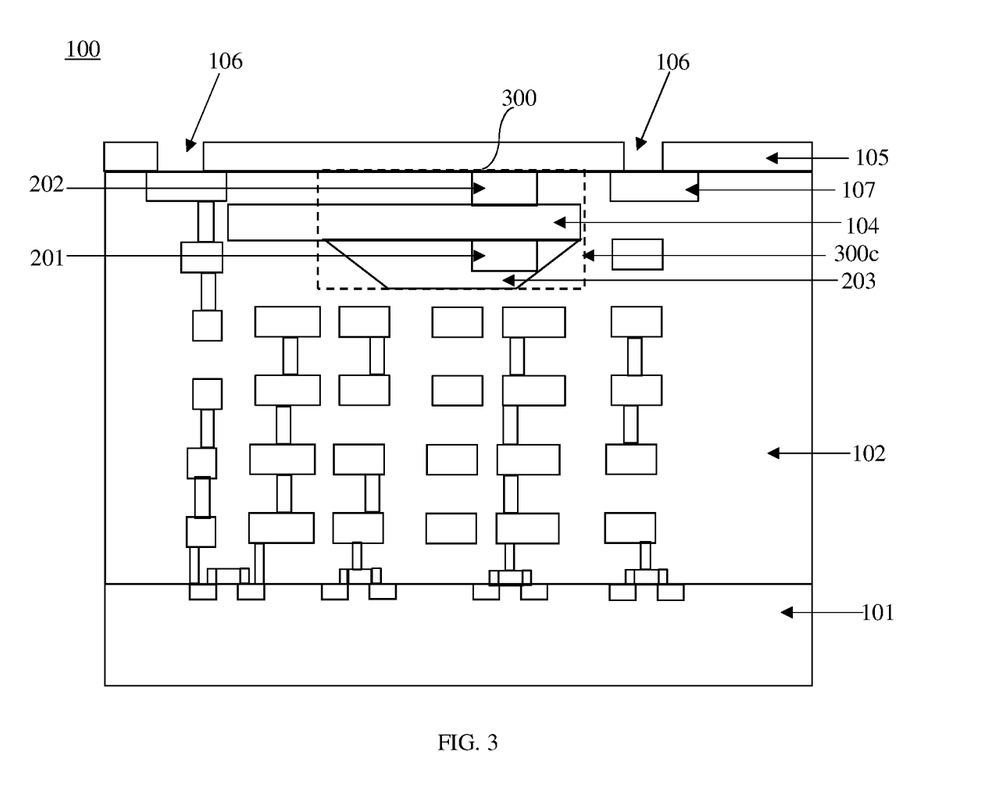
FIG. 3 is a schematic diagram illustrating a preferred embodiment of the device that comprises a sensing instrument having a sensing component that operates at film bulk acoustic resonator (FBAR) mode.

For sensing component 300b, 300c that operates at either Lamb mode FBAR mode, a cavity 203 is formed within the inter-layer dielectric 102 that is adjacent to at least a portion of the inner surface of the piezoelectric layer 104 with one or more inner electrodes 201 being accommodated therewithin. The cavity 203 provides an air gap for acoustic isolation to prevent the waves from propagating into the inter-layer dielectric 102, in particular the portion of the inter-layer dielectric 102 that is in between the inner surface of the piezoelectric layer 104 and the substrate layer 101, such that the waves are localized within the piezoelectric layer 104 to minimize acoustic loss during operation of the sensing component 300b, 300c. This sensing component 300b, 300c is provided with one or more outer electrodes 202 connected to the outer surface of the piezoelectric layer 104 and are disposed between the binding layer 105 and the outer surface of the piezoelectric layer 104.

The sensing component 300b operating at Lamb mode to generate longitudinal waves is provided with a pair of electrode arrays with one inner electrode array and one outer electrode array that corresponds to the inner electrode array in terms of charge type. Each electrode array comprises two or more electrodes that are configured in alternate charge arrangement. The outer electrodes 202 each has a charge opposite of its corresponding inner electrodes 201. In an example of a Lamb mode operating sensing component 300b that has a first pair of electrodes, a second pair of electrodes and a third pair of electrodes that are arranged in sequential order, the first inner electrode is an anode whereas the first outer electrode that corresponds to the first inner electrode is a cathode. The second inner electrode is a cathode whereas the second outer electrode that corresponds to the second inner electrode is an anode. The third inner electrode is an anode whereas its corresponding third outer electrode is a cathode. A preferred method to fabricate such electrodes for the Lamb mode operating sensing component 300b is to have a single inner electrode piece and a single outer electrode piece that are respectively etched to form two or more inner electrodes 201 and outer electrodes 202.

The sensing component 300c that operates at FBAR mode is provided with the inner electrode 201 and the outer electrode 202 configured in a charge opposite of each other to produce transverse waves and longitudinal waves. By way of example, but not by way of limitation, the sensing component 300c that operates at FBAR mode has a pair of electrodes being an anodic inner electrode 201 and a cathodic outer electrode 202, or vice versa. With only one inner electrode 201 and one outer electrode 202 required to perform FBAR mode, the FBAR mode operating sensing component 300c has less manufacturing complexity as compared to the Lamb mode operating sensing component 300b.

The present invention allows information determination of substances in the same state or different states, be it gas, liquid or solid. FIG. 1 to FIG. 3 each depict the device 100 with the sensing instrument 300 having a single mode sensing component with FIG. 1 showing the device 100 having the SAW mode operating sensing component 300a, FIG. 2 illustrating the device 100 having the Lamb mode operating sensing component 300b, and FIG. 3 exhibiting the device 100 having the FBAR mode operating sensing component 300c. The SAW mode operating sensing component 300a is suitable for determining information of substance in solid state due to its high sensitivity in solid substance detection. On the other hand, Lamb and FBAR mode operating sensing components 300b, 300c have high sensitivity for liquid substance detection and therefore are suitable for determining information of substance in liquid state.

In other embodiments of the present invention, the device 100 has a sensing instrument 300 that comprises two or more sensing components. The sensing instrument 300 in the device 100 depicted in FIG. 6 has both the Lamb mode operating sensing component 300b and FBAR mode operating sensing component 300c that are both sensitive towards liquid substance detection. The sensing instrument 300 of this device 100 comprises both the inner electrodes 201 and outer electrodes 202, with the inner electrodes 201 being accommodated within the cavity 203 formed in the inter-layer dielectric 102 under the piezoelectric layer 104.

Figure 4:
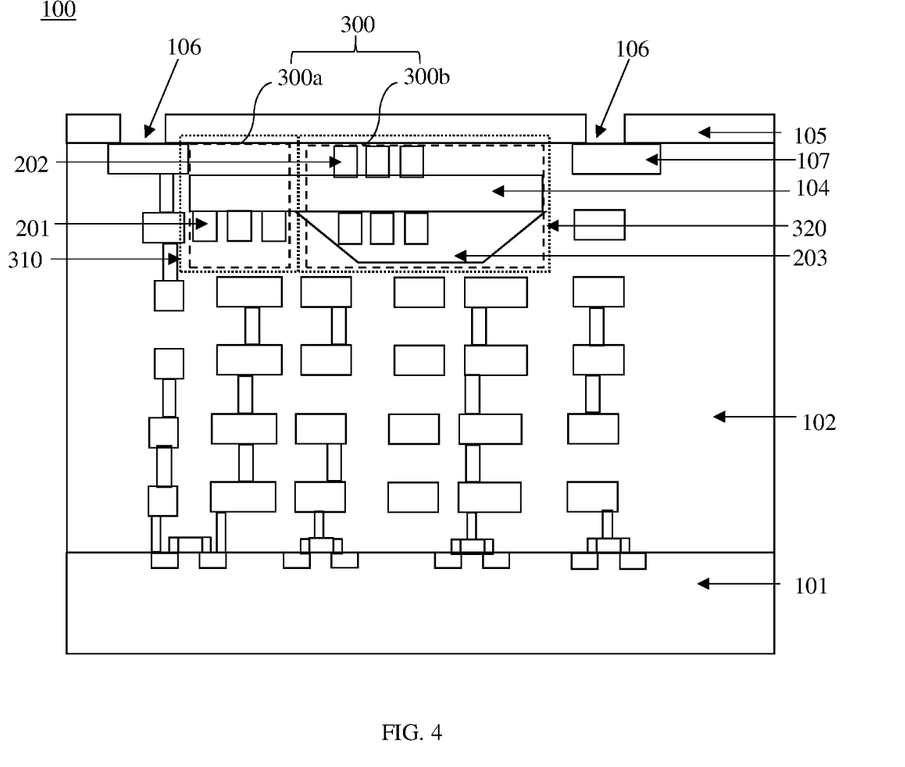
FIG. 4 is a schematic diagram illustrating a preferred embodiment of the device that comprises a sensing instrument having sensing components that respectively operate at surface acoustic wave (SAW) mode and Lamb mode.
Figure 5:
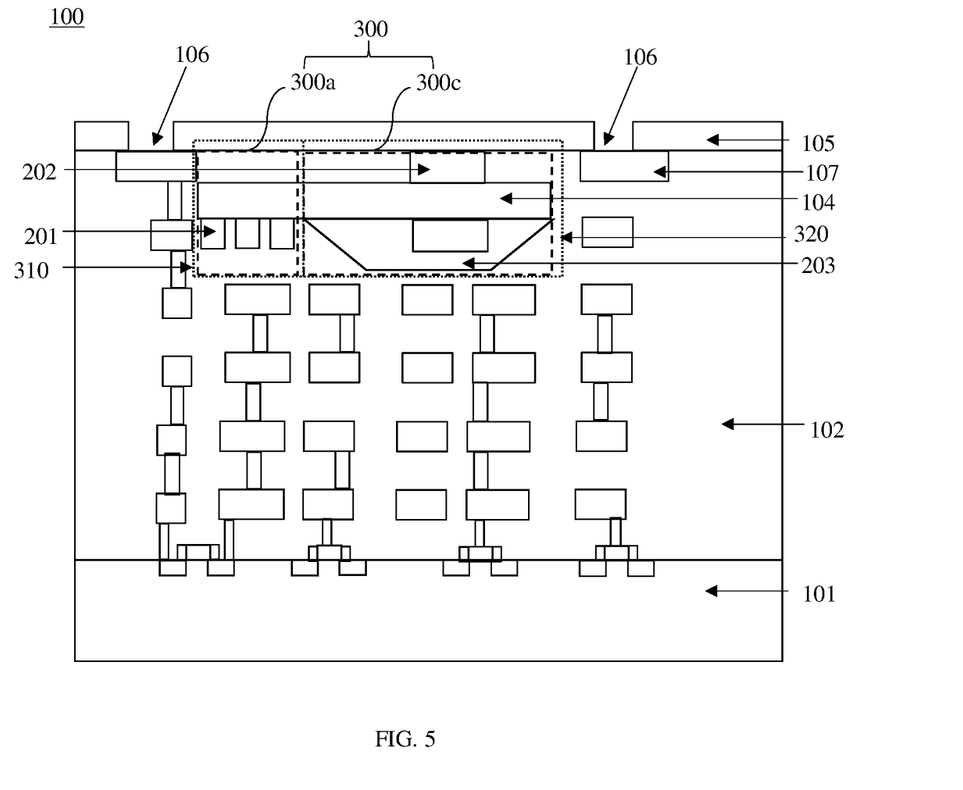
FIG. 5 is a schematic diagram illustrating a preferred embodiment of the device that comprises a sensing instrument having sensing components that respectively operate at surface acoustic wave (SAW) mode and film bulk acoustic resonator (FBAR) mode.
Figure 6:
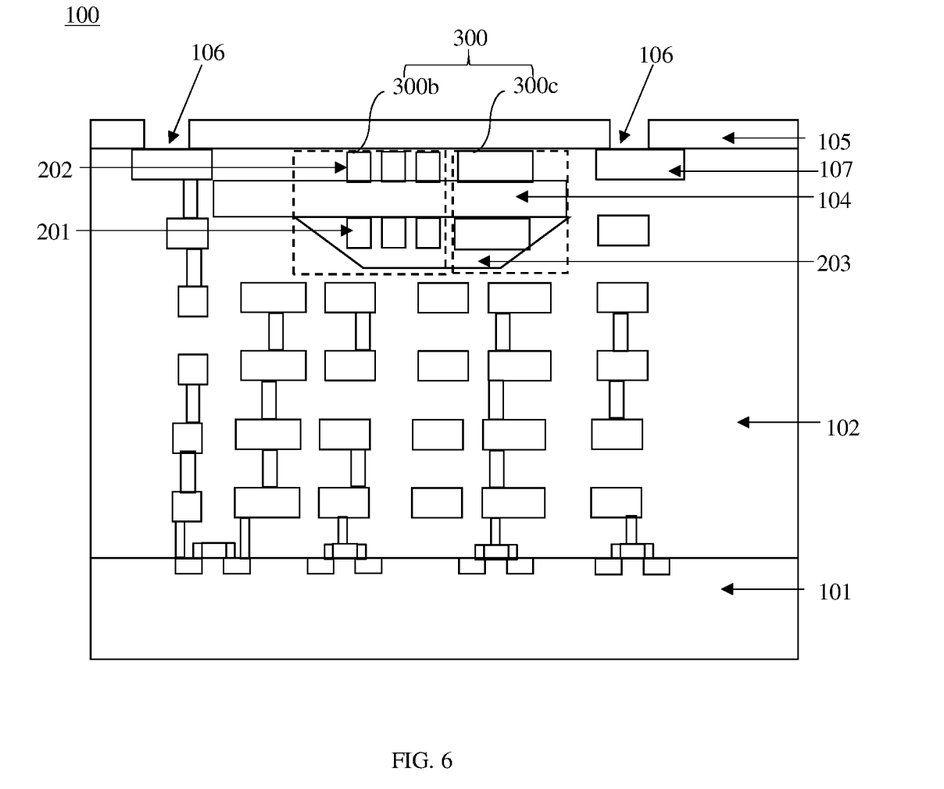
FIG. 6 is a schematic diagram illustrating a preferred embodiment of the device that comprises a sensing instrument having sensing components that respectively operate at Lamb mode and film bulk acoustic resonator (FBAR) mode.
Figure 7:
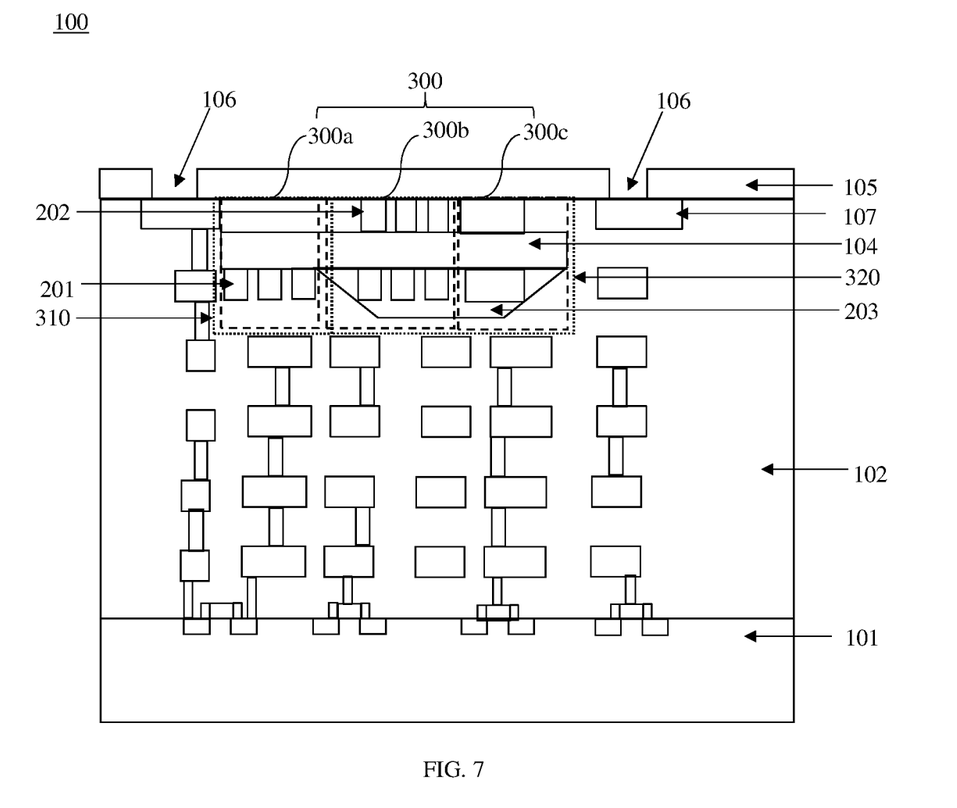
FIG. 7 is a schematic diagram illustrating a preferred embodiment of the device that comprises a sensing instrument having sensing components that respectively operate at surface acoustic wave (SAW) mode, Lamb mode and film bulk acoustic resonator (FBAR) mode.

FIG. 4 shows the device 100 having the sensing instrument 300 that includes the SAW mode operating sensing component 300a and the Lamb mode operating sensing component 300b. On the other hand, FIG. 5 shows the device 100 having the sensing instrument 300 that comprises the SAW mode operating sensing component 300a and the FBAR mode operating sensing component 300c. Thus, both the sensing instruments 300 of the device 100 in FIG. 4 and FIG. 5 respectively is capable of detecting solid and liquid substances. Other than combining two sensing components of different modes, the sensing instrument 300 of can comprise three sensing components of different modes as illustrated in FIG. 7 where the sensing instrument 300 comprises the SAW mode operating sensing component 300a, the Lamb mode operating sensing component 300b, and the FBAR mode sensing component 300c. The sensing instrument 300 of the device 100 in FIG. 7 is suitable for detecting liquid and solid substances. The sensing instrument 300 functionable at any combination of SAW mode, Lamb mode and FBAR mode offers greater efficiency, accuracy, sensitivity, and detection speed to the device 100 as compared to a single mode device.

For sensing instruments 300 that contain the SAW mode operating sensing component 300a and either or both the Lamb mode operating sensing component 300b and FBAR mode operating sensing component 300c as illustrated in FIG. 4, FIG. 5 and FIG. 7, the sensing instrument 300 is divided into a first sensing section 310 having the SAW mode operating component 300a, and a second sensing section 320 having either or both the Lamb mode operating sensing component 300b and FBAR mode operating sensing component 300c. The first section 310 has inner electrodes 201 and the piezoelectric layer 104, whereas the second section 320 has both inner electrodes 201 and outer electrodes 202, piezoelectric layer 104 and the cavity 203.

The binding layer 105 can be shared by the first sensing section 310 and second sensing section 320, during which the material selection for the binding layer 105 is compatible thereto. Optionally, more than one binding layers 105 can be provided by the device 100, which each binding layer 105 is compatible to the first sensing section 310 or second sensing section 320. Further another option of the present invention is that each sensing component 300a, 300b, 300c can be provided with a compatible binding layer 105 including those that share the same sensing section 310, 320. Upon interacting with the matter, presence of the substance at the binding layer 105 reduces the frequency that produces either or both transverse and longitudinal waves, such that the frequency shift is detectable in a form of electrical signal. Such configuration of the binding layer 105 enables detection flexibility in the device 100 to simultaneously determine information of a mixture having two or more substances in the state of solid, liquid, gas, or any combination thereof. The binding layer 105 can be selected from a hydrophobic or hydrophilic material.

The present disclosure includes as contained in the appended claims, as well as that of the foregoing description. Although this invention has been described in its preferred form with a degree of particularly, it is understood that the present disclosure of the preferred form has been made only by way of example and that numerous changes in the details of construction and the combination and arrangements of parts may be resorted to without departing from the scope of the invention.

What is claimed is:

1. A device for determining information of a substance in a matter, comprising:
    a first outermost layer being a substrate layer;
    an inter-layer dielectric disposed on the substrate layer;
    an electronic circuitry substantially formed in the inter-layer dielectric and includes a plurality of metal layers with at least one metal layer being used as an inner electrode;
    a sensing instrument having at least one sensing component that includes a piezoelectric layer and the inner electrode that is positioned adjacent to an inner surface of the piezoelectric layer; and
    a second outermost layer, disposed on the inter-layer dielectric, for binding to the substance;
    wherein the sensing component allows the device to determine the information of the substance upon detecting presence of the substance at the second outermost layer.

2. The device according to claim 1, wherein the sensing component further includes at least one outer electrode being one of the metal layers from the electronic circuitry, the outer electrode is disposed between the second outermost layer and outer surface of the piezoelectric layer.

3. The device according to claim 2, wherein the inter-layer dielectric is formed with a cavity adjacent to at least a portion of the inner surface of the piezoelectric layer with one or more inner electrodes being accommodated therewithin.

4. The device according to claim 1, wherein the sensing component operates at surface acoustic wave mode by having two or more inner electrodes configured in an alternate charge arrangement to produce transverse waves.

5. The device according to claim 3, wherein the sensing component operates at Lamb mode by having two or more inner electrodes configured in an alternate charge arrangement and the outer electrodes having a charge opposite of their corresponding inner electrodes to produce longitudinal waves.

6. The device according to claim 3, wherein the sensing component operates at Lamb mode by having two or more inner electrodes configured in an alternate charge arrangement and the outer electrodes having a charge opposite of their corresponding inner electrodes to produce longitudinal waves.

7. The device according to claim 1, further comprising at least one bond-pad opening that extends through the second outermost layer and partially into the inter-layer dielectric until the bond-pad opening reaches one of the metal layers from the electronic circuitry that serves as a bond pad.

8. The device according to claim 1, wherein the information includes any one or a combination of amount, mass and type of the substance.

9. The device according to claim 1, wherein the inter-layer dielectric is made of silicon dioxide, silicon nitride or silicon oxynitride.

10. A device for determining information of a substance in a matter, comprising:
    a first outermost layer being a substrate layer;
    an inter-layer dielectric disposed on the substrate layer;
    an electronic circuitry substantially formed in the inter-layer dielectric includes a plurality of metal layers with at least one metal layer being used as an inner electrode and at least one metal layer being used as an outer electrode;
    a sensing instrument having at least one sensing component that includes a piezoelectric layer having an inner surface and an outer surface, the inner electrode being disposed on the inner surface of the piezoelectric layer, and the outer electrode being disposed on the outer surface of the piezoelectric layer; and
    a second outermost layer, disposed on the inter-layer dielectric and adjacent to the other electrode, for binding to the substance;
    wherein the inter-layer dielectric is formed with a cavity adjacent to at least a portion of the inner surface of the piezoelectric layer with the inner electrode being accommodated therewithin such that the sensing component produces either or both longitudinal waves, and transverse and longitudinal waves for the device to determine the information of the substance upon detecting presence of the substance at the second outermost layer.

11. The device according to claim 10, wherein the sensing component operates at Lamb mode by having two or more inner electrodes configured in an alternate charge arrangement and the outer electrodes having a charge opposite of their corresponding inner electrodes to produce the longitudinal waves.

12. The device according to claim 10, wherein the sensing component operates at film bulk acoustic resonator mode by having the inner electrode and the outer electrode configured in a charge opposite to each other to produce the transverse and longitudinal waves.

13. The device according to claim 10, further comprising at least one bond-pad opening that extends through the second outermost layer and partially into the inter-layer dielectric until the bond-pad opening reaches one of the metal layers from the electronic circuitry that serves as a bond pad.

14. The device according to claim 10, wherein the information includes any one or a combination of amount, mass and type of the substance.

15. The device according to claim 10, wherein the inter-layer dielectric is made of silicon dioxide, silicon nitride or silicon oxynitride.

16. A device for determining information of a substance in a matter, comprising:
 a first outermost layer being a substrate layer;
 an inter-layer dielectric disposed on the substrate layer;
 an electronic circuitry substantially formed in the inter-layer dielectric and includes a plurality of metal layers of which a number of them are used as inner electrodes and outer electrodes;
 a sensing instrument having a first sensing section provided with at least one sensing component that includes
 a piezoelectric layer having an inner surface and an outer surface, and the inner electrode being disposed on the inner surface of the piezoelectric layer;
 a second sensing section provided with at least one sensing component that includes the piezoelectric layer, the inner electrode being disposed on the inner surface of the piezoelectric layer, and the outer electrode being disposed on the outer surface of the piezoelectric layer; and
 a second outermost layer disposed on the inter-layer dielectric and adjacent to the outer electrode, for binding to the substance;
 wherein the inter-layer dielectric at the second sensing section is formed with a cavity adjacent to at least a portion of the inner surface of the piezoelectric layer with one or more inner electrodes being accommodated therewithin such that the sensing instrument produces either or both transverse and longitudinal waves for the device to determine the information of the substance upon detecting presence of the substance at the second outermost layer.

17. The device according to claim 16, wherein the sensing component within the first sensing section operates at surface acoustic wave mode by having two or more inner electrodes configured in an alternate charge arrangement to produce the transverse waves.

18. The device according to claim 16, wherein the sensing component within the first sensing section operates at surface acoustic wave mode by having two or more inner electrodes configured in an alternate charge arrangement to produce the transverse waves.

19. The device according to claim 16, wherein the sensing component within the second sensing section operates at film bulk acoustic resonator mode by having the inner electrode and the outer electrode configured in a charge opposite to each other to produce the transvers and longitudinal waves.

20. The device according to claim 16 is formed with at least a bond-pad opening that extends through the second outermost layer and partially into the inter-layer dielectric until the bond-pad opening reaches one of the metal layers from the electronic circuitry that serves as a bond pad.

21. The device according to claim 16, wherein the information includes any one or a combination of amount, mass and type of the substance.

22. The device according to claim 16, wherein the inter-layer dielectric is made of silicon dioxide, silicon nitride or silicon oxynitride.

* * * * *